United States Patent
Choi et al.

(10) Patent No.: US 8,120,113 B2
(45) Date of Patent: Feb. 21, 2012

(54) METAL LINE IN SEMICONDUCTOR DEVICE

(75) Inventors: Young-Soo Choi, Ichon-shi (KR); Gyu-Hyun Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 10 days.

(21) Appl. No.: 12/688,738

(22) Filed: Jan. 15, 2010

(65) Prior Publication Data

US 2010/0117235 A1 May 13, 2010

Related U.S. Application Data

(62) Division of application No. 11/770,681, filed on Jun. 28, 2007, now Pat. No. 7,648,904.

(30) Foreign Application Priority Data

Sep. 29, 2006 (KR) .................. 10-2006-0096346

(51) Int. Cl.
*H01L 21/00* (2006.01)

(52) U.S. Cl. ......... 257/357; 257/E21.121; 257/E21.577; 257/E21.579; 257/E23.016; 257/E23.019

(58) Field of Classification Search ........... 257/E21.121, 257/169, 577–595, 23.016–23.019, 145
See application file for complete search history.

(56) References Cited

U.S. PATENT DOCUMENTS

| | | | |
|---|---|---|---|
| 5,646,067 A | 7/1997 | Gaul | |
| 5,693,564 A * | 12/1997 | Yu | 438/646 |
| 5,904,565 A | 5/1999 | Nguyen | |
| 5,981,382 A * | 11/1999 | Konecni et al. | 438/646 |
| 5,985,751 A | 11/1999 | Koyama | |
| 5,990,011 A | 11/1999 | McTeer | |
| 6,023,102 A | 2/2000 | Nguyen et al. | |
| 6,025,277 A * | 2/2000 | Chen et al. | 438/738 |
| 6,077,782 A * | 6/2000 | Hsu et al. | 438/688 |
| 6,143,645 A * | 11/2000 | Hsu et al. | 438/627 |
| 6,143,646 A | 11/2000 | Wetzel | |
| 6,217,721 B1 * | 4/2001 | Xu et al. | 204/192.17 |
| 6,228,764 B1 | 5/2001 | Hwang | |
| 6,334,249 B2 * | 1/2002 | Hsu | 29/852 |
| 6,432,811 B1 | 8/2002 | Wong | |
| 6,458,255 B2 | 10/2002 | Chiang et al. | |
| 6,468,908 B1 | 10/2002 | Chen et al. | |
| 6,537,905 B1 * | 3/2003 | Chen et al. | 438/629 |
| 6,689,658 B2 | 2/2004 | Wu | |

(Continued)

FOREIGN PATENT DOCUMENTS

CN 1233856 A 11/1999

(Continued)

*Primary Examiner* — Michael Lebentritt
(74) *Attorney, Agent, or Firm* — Kilpatrick Townsend & Stockton LLP (57) ABSTRACT

A metal line in a semiconductor device includes an insulation layer having trenches formed therein, a barrier metal layer formed over the insulation layer and the trenches, a metal layer formed over the barrier metal layer, wherein the metal layer fills the trenches, and an anti-galvanic corrosion layer formed on an interface between the metal layer and the barrier metal layer.

5 Claims, 5 Drawing Sheets

U.S. PATENT DOCUMENTS

| | | | |
|---|---|---|---|
| 6,790,774 B2 | 9/2004 | Fujikawa | |
| 6,911,124 B2 | 6/2005 | Tang et al. | |
| 6,958,291 B2 * | 10/2005 | Yu et al. | 438/637 |
| 7,012,335 B2 | 3/2006 | Lee et al. | |
| 7,145,241 B2 | 12/2006 | Takayama et al. | |
| 7,189,650 B2 | 3/2007 | Liu et al. | |
| 7,332,449 B2 | 2/2008 | Wang et al. | |
| 7,452,822 B2 | 11/2008 | Shih et al. | |
| 7,541,279 B2 | 6/2009 | Kim et al. | |
| 7,560,369 B2 | 7/2009 | Kim | |
| 2001/0002510 A1 * | 6/2001 | Hsu | 29/852 |

FOREIGN PATENT DOCUMENTS

| | | |
|---|---|---|
| CN | 1238812 | 12/1999 |
| CN | 1286497 | 3/2001 |
| CN | 1433567 | 7/2003 |
| EP | 1 376 685 A2 | 1/2004 |
| KR | 1999-0063182 | 7/1999 |
| KR | 100238438 B1 | 10/1999 |
| KR | 1020050055328 A | 6/2005 |
| KR | 1020050066823 A | 6/2005 |

* cited by examiner

METAL LINE IN SEMICONDUCTOR DEVICE

CROSS-REFERENCE TO RELATED APPLICATIONS

The present invention is a divisional of U.S. patent application Ser. No. 11/770,681, which claims priority to Korean patent application number 10-2006-0096346, filed on Sep. 29, 2006, which is incorporated by reference in its entirety.

BACKGROUND OF THE INVENTION

The present invention relates to a method for fabricating a semiconductor device, and more particularly, to a method for forming a metal bit line in a flash memory device using a damascene process.

A bar resistance that is appropriate for an operation characteristic of a flash memory device may be difficult to obtain if tungsten (W) is used as a bit line when fabricating a flash memory device smaller than 60 nm. A method for forming a metal line using aluminum (Al) or copper (Cu) instead of tungsten has been introduced to address this problem. Typically, a method for forming a metal line using aluminum includes depositing aluminum and then performing a reactive ion etch (RIE) process. However, it may be difficult to obtain a uniformly etched surface. Furthermore, a loss of aluminum may occur on a bottom interface when forming the metal line using the RIE process. Thus, the aluminum line may be difficult to embody when a critical dimension (CD) of the metal line is low. A metal line including copper is formed using a damascene process. The damascene process generally has a better electro-migration characteristic than the RIE process.

The damascene process is commonly used to form a metal line including copper or aluminum. A barrier metal layer is provided on an interface of an insulation layer to decrease diffusion of the copper or aluminum into the insulation layer. When compared to the metal line including aluminum (hereinafter referred to as the aluminum line), the formation of the metal line including copper (hereinafter referred to as the copper line) using the damascene process provides a better electro-migration characteristic and better stability when performing a chemical mechanical polishing (CMP) process to isolate lines. However, the formation of the copper line generally requires an independent work space and apparatus for forming the copper line because of a diffusion characteristic of copper. It should be noted that copper has a fast diffusion speed in silicon or an oxide-based material used as an insulation layer.

In contrast, the aluminum line formed using the damascene process may provide advantages because the aluminum line may form a denser layer than the copper line. Also, aluminum may not diffuse into silicon or an insulation layer. However, the aluminum line is less stable than the copper line and therefore has a diminished electro-migration characteristic. Thus, the aluminum line may easily corrode. In particular, galvanic corrosion supplying electrons to a barrier metal layer may occur at a contact region with the barrier metal layer which includes a metal other than aluminum. Such a characteristic may increase the bar resistance of the metal line and adversely impact the reliability of the device.

Figure 1:
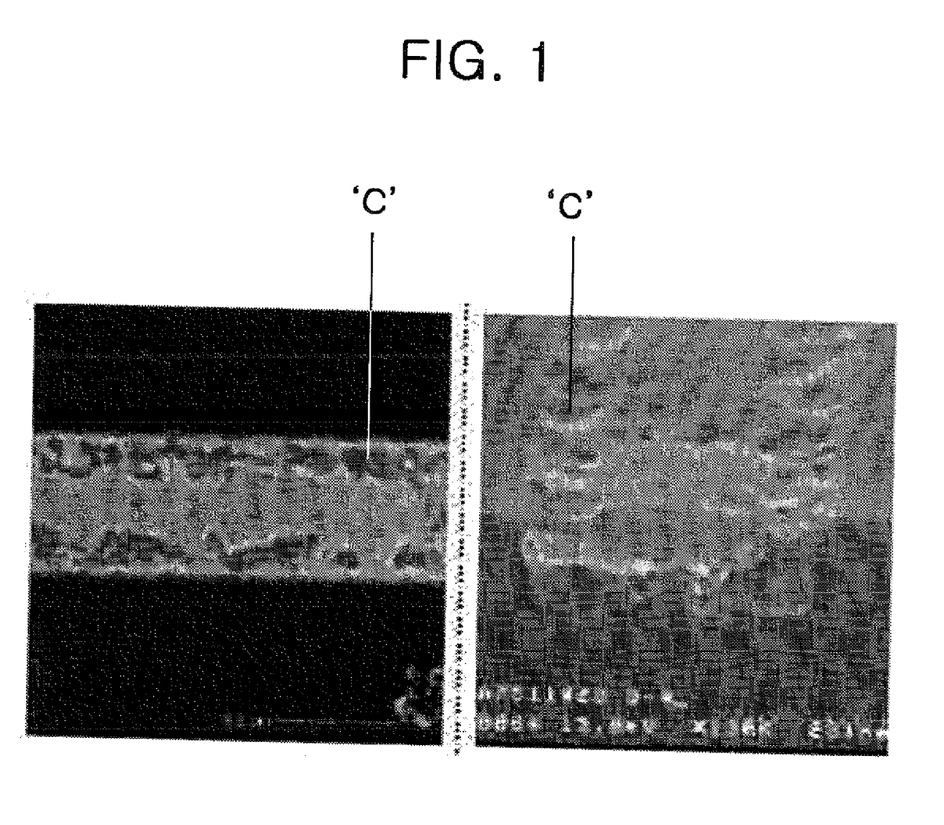
FIG. 1 illustrates micrographic views of galvanic corrosion generated between an aluminum line and a barrier metal layer during a conventional cleaning process when forming the aluminum line using a damascene process.

After performing the CMP process for electrically isolating adjacent aluminum lines, a cleaning process is performed to remove slurry residue and polish by-products generated during the CMP process. The cleaning process typically uses an ammonia ($NH_3$)-based or hydrogen fluoride (HF)-based cleaning solution. Consequently, the cleaning solution chemically damages the aluminum line and galvanic corrosion occurs. Therefore, an improved cleaning solution for decreasing the galvanic corrosion during a cleaning process is desired. FIG. 1 illustrates micrographic views of galvanic corrosion (referred to as 'C') generated between an aluminum line and a barrier metal layer during a cleaning process after a CMP process is performed.

SUMMARY OF THE INVENTION

Embodiments of the present invention provide a metal line in a semiconductor device and a method for forming the same. The semiconductor device having the metal line of the present invention can decrease galvanic corrosion at a contact region between a metal layer for forming the metal line and a barrier metal layer using a damascene process.

In accordance with an aspect of the present invention, a metal line is provided in a semiconductor device. The metal layer includes an insulation layer having trenches formed therein; a barrier metal layer formed over the insulation layer and the trenches; a metal layer formed over the barrier metal layer, wherein the metal layer fills the trenches; and an anti-galvanic corrosion layer formed on an interface between the metal layer and the barrier metal layer.

In accordance with another aspect of the present invention, a method for forming a metal line in a semiconductor device is provided. The method includes providing a substrate including an insulation layer having a plurality of trenches formed therein; forming a barrier metal layer over the insulation layer and the trenches; forming a first metal layer over the barrier metal layer; forming a second metal layer over the first metal layer, wherein the second metal layer fills the trenches; and forming an anti-galvanic corrosion layer on an interface between the barrier metal layer and the second metal layer using a thermal process.

In accordance with still another aspect of the present invention, a method for forming a metal line in a semiconductor device is provided. The method includes providing a substrate including an insulation layer having a plurality of trenches formed therein; forming a barrier metal layer over the insulation layer and the trenches; and forming a metal layer including a first metal over the barrier metal layer, the metal layer filling the trenches, wherein a gas including a second metal is supplied when forming the metal layer to form an anti-galvanic corrosion layer on an interface between the barrier metal layer and the metal layer.

DESCRIPTION OF SPECIFIC EMBODIMENTS

Embodiments of the present invention are directed to a metal line in a semiconductor device and a method for forming the same. According to embodiments of the present invention, an anti-galvanic corrosion layer is formed on an interface between a barrier metal layer and a metal layer when forming a metal line using a damascene process. The anti-galvanic corrosion layer includes an alloy layer comprising a material of the metal layer. Accordingly, galvanic corrosion may be reduced at the interface between the barrier metal layer and the metal layer.

Subacidic polish slurry with a pH ranging from approximately 4 to approximately 6 is used during a planarization process of the metal layer. Thus, galvanic corrosion between the barrier metal layer and the metal layer may be decreased. The galvanic corrosion may be further reduced by adding a metal corrosion inhibitor into a deionized water cleaning solution such that the pH of the cleaning solution may range from approximately 8 to approximately 10. In other words, the cleaning solution is maintained as a basic solution during a cleaning process performed after the planarization process.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals throughout the various embodiments of the present invention represent the same or like elements in different drawings.

FIGS. 2A to 2D illustrate cross-sectional views of a method for forming a metal line in a semiconductor device in accordance with a first embodiment of the present invention.

Figure 2A:
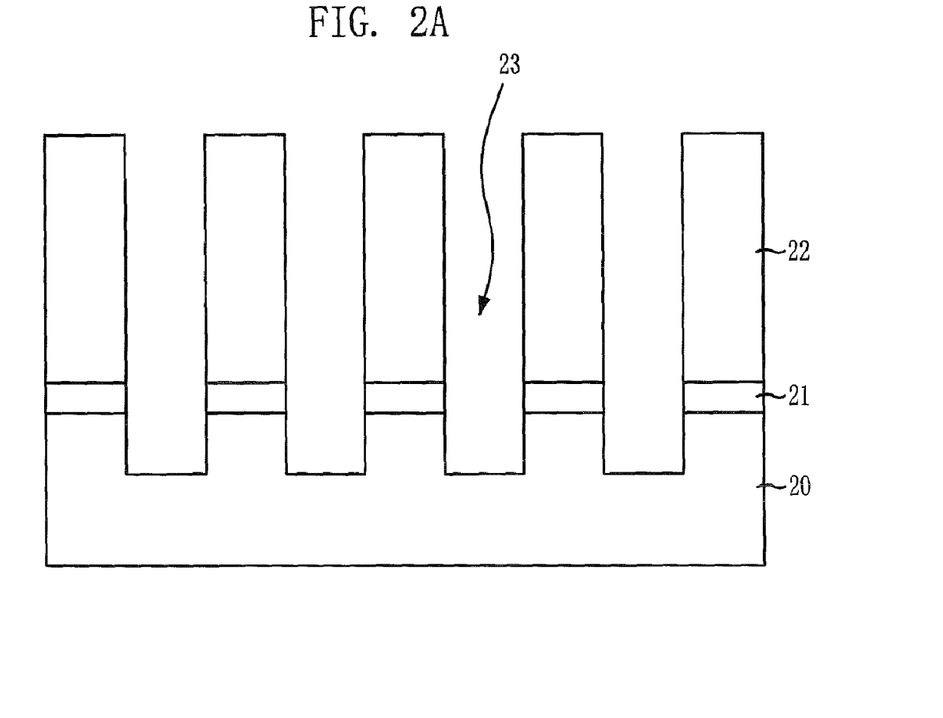
FIGS. 2A to 2D illustrate cross-sectional views of a method for forming a metal line in a semiconductor device in accordance with a first embodiment of the present invention.

Referring to FIG. 2A, a first insulation pattern 20, an etch stop layer 21, and a second insulation pattern 22 are formed over a substrate (not shown) including a plurality of conductive layers (not shown). Specifically, a first insulation layer is formed over the substrate. The first insulation layer includes an oxide-based material. A nitride-based layer is formed over the first insulation layer. The nitride-based layer functions as an etch mask such that the first insulation layer may be selectively etched. A second insulation layer is formed over the nitride-based layer. The second insulation layer includes an oxide-based material that has a different selectivity than the nitride-based layer. For example, the second insulation layer may comprise $TSiO_2$, tetraethyl orthosilicate (TEOS), high density plasma (HDP), or undoped silicate glass (USG). The second insulation layer may include a low-k dielectric layer formed by employing a spin on method or a chemical vapor deposition (CVD) method. The second insulation layer may be formed to a thickness ranging from approximately 100 Å to approximately 2,500 Å.

Portions of the second insulation layer, the nitride-based layer, and the first insulation layer are etched to form trenches 23. Thus, the second insulation pattern 22, the etch stop layer 21, and the first insulation pattern 20 are formed. The trenches 23 are formed using two etch processes. A first etch process stops etching above the nitride-based layer. The first insulation layer is etched by a second etch process. The trenches 23 may be formed to a depth ranging from approximately 1,500 Å to approximately 3,000 Å.

Figure 2B:
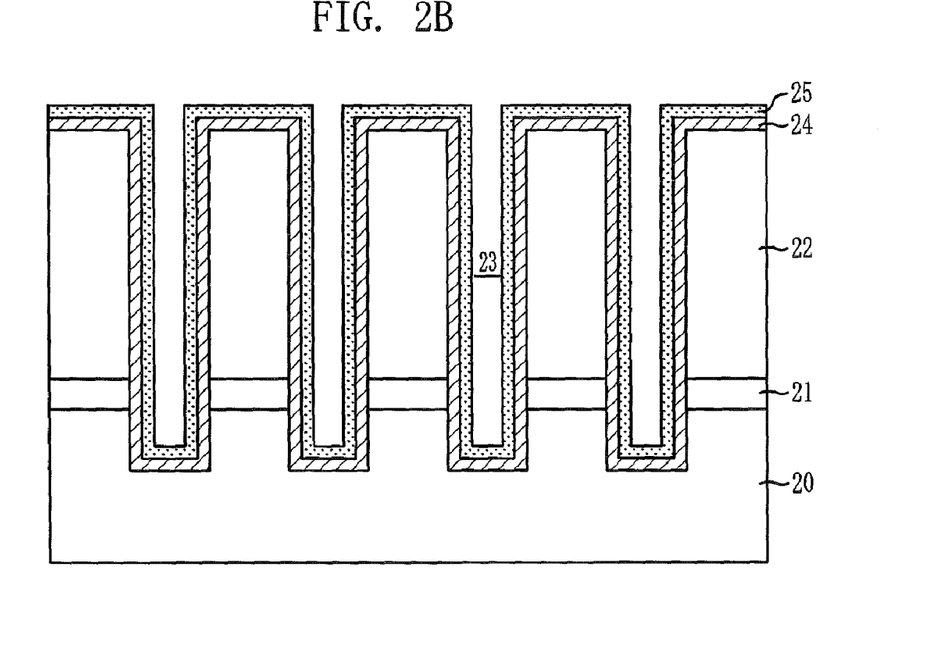

Referring to FIG. 2B, a barrier metal layer 24 is formed over the resultant structure. The barrier metal layer 24 may include a stack structure comprising titanium (Ti)/titanium nitride (TiN), Ti/TiN/Ti, tantalum (Ta)/tantalum nitride (TaN), Ta/TaN/Ta, Ti/titanium silicon nitride (TiSiN), or Ti/TiSiN/Ti. In particular, the barrier metal layer 24 may be formed using a CVD method or a physical vapor deposition (PVD) method. The barrier metal layer 24 may be formed to a thickness of approximately 80 Å or less in a horizontal direction in consideration of a step coverage characteristic of the barrier metal layer 24. A copper layer 25 having a relatively small thickness is formed over the surface profile of the barrier metal layer 24. The copper layer 25 may be formed to a thickness of approximately 50 Å or less using a PVD method.

Figure 2C:
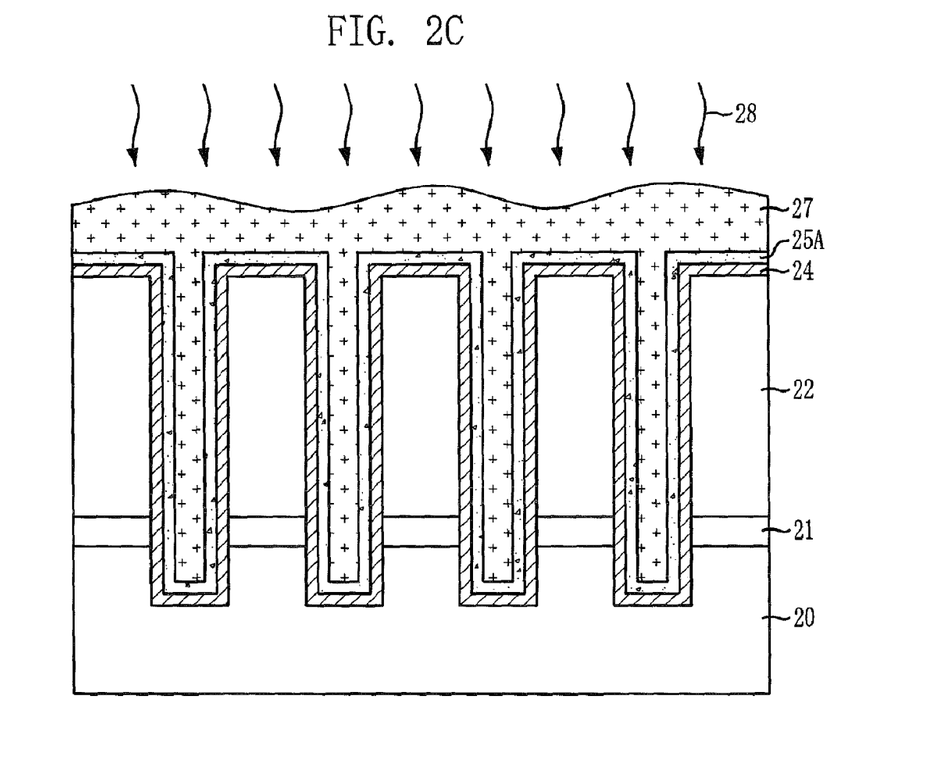

Referring to FIG. 2C, an aluminum layer 27 is formed to have a relatively large thickness over the copper layer 25 (FIG. 2B) such that the aluminum layer 27 fills the trenches 23 (FIG. 2B). The aluminum layer 27 may be formed using a CVD method.

A thermal process 28 is performed to form an aluminum copper (AlCu) alloy layer 25A between the aluminum layer 27 and the barrier metal layer 24. The copper layer 25 reacts with the aluminum layer 27 by the heat generated during the thermal process 28 to form the AlCu alloy layer 25A. Therefore, in accordance with the first embodiment of the present invention, galvanic corrosion may be reduced at an interface between the aluminum layer 27 and the barrier metal layer 24 due to the AlCu alloy layer 25A formed on the interface between the aluminum layer 27 and the barrier metal layer 24.

The AlCu alloy layer 25A may reduce galvanic corrosion because Al has a strong anodic propensity for providing electrons. When Al combines with Cu having a stronger cathodic propensity than Al, an electro-migration characteristic improves thereby reducing galvanic corrosion.

Figure 2D:
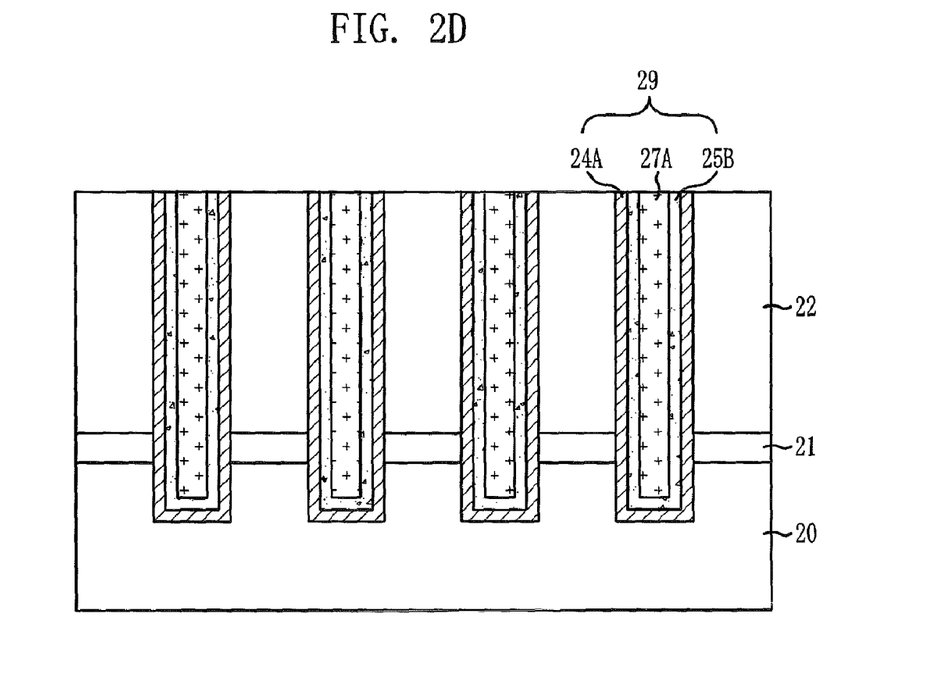

Referring to FIG. 2D, a CMP process is performed to form a plurality of metal lines 29 electrically isolated from each other in the trenches 23 (FIG. 2B). The metal lines 29 each comprise a patterned barrier metal layer 24A, a patterned AlCu alloy layer 25B, and a patterned aluminum layer 27A. It is important to control the pH and composition of a polish slurry during the CMP process in order to decrease pitting corrosion on a surface of the aluminum layer 27 and galvanic corrosion on an interface of the barrier metal layer 24. For example, a CMP process includes oxidizing aluminum and then removing the oxidized aluminum using a polish slurry with a pH ranging from approximately 4 to approximately 6. Specifically, an oxidizer of approximately 2 wt % to approximately 6 wt % is added to oxidize the aluminum. Colloidal silica or aluminum oxide ($Al_2O_3$)-based polish particles are used to remove the oxidized aluminum. For example, the oxidizer used in the CMP process may include hydrogen peroxide ($H_2O_2$), $Fe(NO_3)_3$, or orthoperiodic acid ($H_5IO_6$). Thus, according to the first embodiment of the present invention, when forming an aluminum line using a damascene process, corrosion of the aluminum line may be prevented during a CMP process.

A cleaning process is performed to remove slurry residue and polish by-products generated during the CMP process. A deionized water (DIW) cleaning solution is used as a basic cleaning solution during the cleaning process to reduce corrosion of the patterned aluminum layer 27A. For example, a temperature of the DIW cleaning solution used during the cleaning process may be maintained from approximately 30° C. to approximately 80° C. The aforementioned temperature is maintained to maximize an enhancing effect of a cleaning reaction characteristic. A metal corrosion inhibitor may be added to the DIW cleaning solution to maintain the pH of the DIW cleaning solution from approximately 8 to approximately 10 (i.e., to maintain the DIW cleaning solution as a basic solution). The concentration of the DIW cleaning solution may range from approximately 50 wt % to approximately 80 wt %.

When methyl gallate is used as the metal corrosion inhibitor, the methyl gallate adsorbs on a surface of the patterned aluminum layer 27A through a chemical combination of an OH group of the methyl gallate and an oxide-based layer formed over the patterned aluminum layer 27A. Thus, a compound of aluminum and an insoluble chelate is formed. Due to this compound, adsorption of chlorine (Cl)⁻ ions and dissolution by DIW may be avoided, and the oxide-based layer formed over the patterned aluminum layer 27A may be protected. A period of time for performing the cleaning process using DIW may be minimized by initially using the cleaning solution including DIW. When adding the methyl gallate, a concentration of the methyl gallate may range from approximately 0.01 wt % to approximately 10 wt %.

Organic type impurities or amine-based hydrazine for removing polymers may be used instead of the metal corrosion inhibitor during the cleaning process. The hydrazine disconnects the main chain of polymers to improve removal efficiency of oxide-based polymers or metal-based polymers. A concentration of the hydrazine may range from approximately 10 wt % to approximately 50 wt %. A small amount of hydrogen fluoride (HF) may be added instead of the metal corrosion inhibitor to efficiently remove slurry residue and polish by-products generated during the polishing process. A predetermined amount of HF is added such that the patterned aluminum layer 27A is not damaged. For example, the amount of HF may range from several ppm to several hundred ppm.

According to the first embodiment of the present invention, the aluminum line will not corrode during the cleaning process performed after the CMP process when forming the aluminum line using the damascene process. Principles of typical galvanic corrosion are described hereinafter using equations related to galvanic corrosion of aluminum.

Typically, when a surface of an aluminum layer is exposed to air, an amorphous oxide layer forms on the surface to protect the surface. However, when anions such as $(SO_4)_2^-$ ions or Cl⁻ ions exist on the aluminum layer or peripheral layers, the anions react with the amorphous oxide layer resulting in the formation of water-soluble salts. When the Cl⁻ ions exist on the aluminum layer, the Cl⁻ ions may move to the amorphous oxide layer. Thus, it becomes difficult to prevent $Al_3^+$ ions from moving to the surface of the aluminum layer. Consequently, aluminum pitting may occur. Accordingly, a first step of the corrosion of the aluminum layer may be the penetration of the Cl⁻ ions in the amorphous oxide layer. Thus, the water-soluble salts formed on the surface of the aluminum layer may be removed, exposing the surface of the aluminum layer. The surface of the aluminum layer is dissolved by an anodic material as shown in Equation 1 below. In other words, the surface of the aluminum layer is dissolved by $Al_3^+$ to induce pits. Equation 1 is an anodic equation with respect to an aluminum layer.

$$Al \rightarrow Al^{3+} + 3e^-$$ [Equation 1]

$$Al^{3+} + H_2O \rightarrow Al(OH)^{2+} + H^+$$

$$Al(OH)^{2+} + H_2O \rightarrow Al(OH)_2^+ + H^+$$

$$Al(OH)_2^+ + H_2O \rightarrow Al(OH)_3 + H^+$$

$$Al(OH)_3 + H_2O \rightarrow Al(OH)_4^- + H^+$$

$$xAl^{3+} + yH_2O \rightarrow Al_x(OH)_y^{3x-y} + yH^+$$

In contrast, a cathodic reaction may occur at a surface of copper included in the aluminum layer, or Ti or TiN configuring a barrier metal layer, as shown in Equation 2 below. Thus, resolution of oxygen or ionization of hydroxide in water may be generated. Equation 2 is a cathodic equation with respect to the barrier metal layer.

$$2H_2O + 2e^- \rightarrow 2OH^- + H_2$$ [Equation 2]

$$O_2 + H_2O + 2e^- \rightarrow 4OH^-$$

A chemical reaction of $Al_3^+$ ions does not occur easily in an aqueous solvent. The chemical reaction may be controlled by a mutual reaction in which $Al_3^+$ ions and water react to form hydrolyzing species. The solubility of Al and the solubility of generated oxyhydrogen depend on the pH of the solution. Thus, the concentration of Al in the solution rapidly changes as the pH of the solution changes from acidic to basic, thereby forming a predominantly stable species where $Al_3^+$ ions may not change under an acidic condition and $Al(OH)_4$ ions may not change under a basic condition.

Figure 3A:
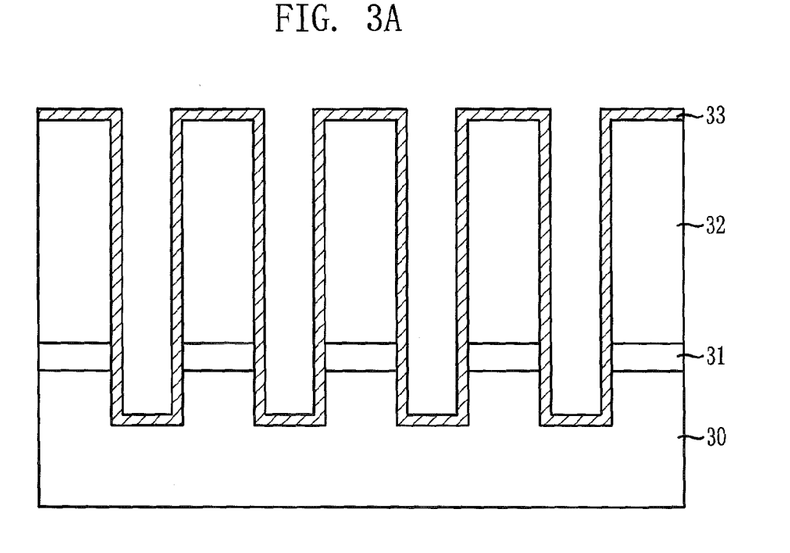
FIGS. 3A to 3C illustrate cross-sectional views of a method for forming a metal line in a semiconductor device in accordance with a second embodiment of the present invention.
Figure 3B:
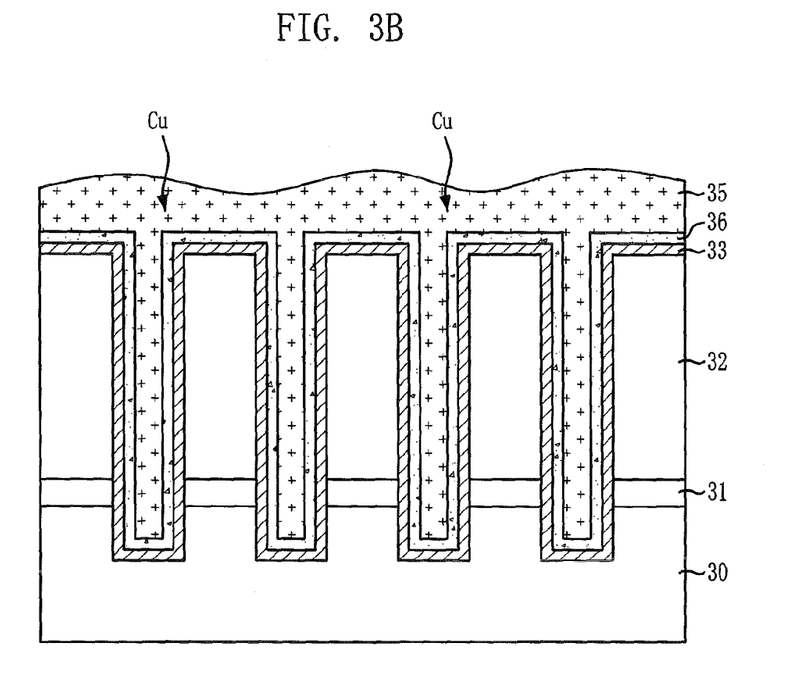
Figure 3C:
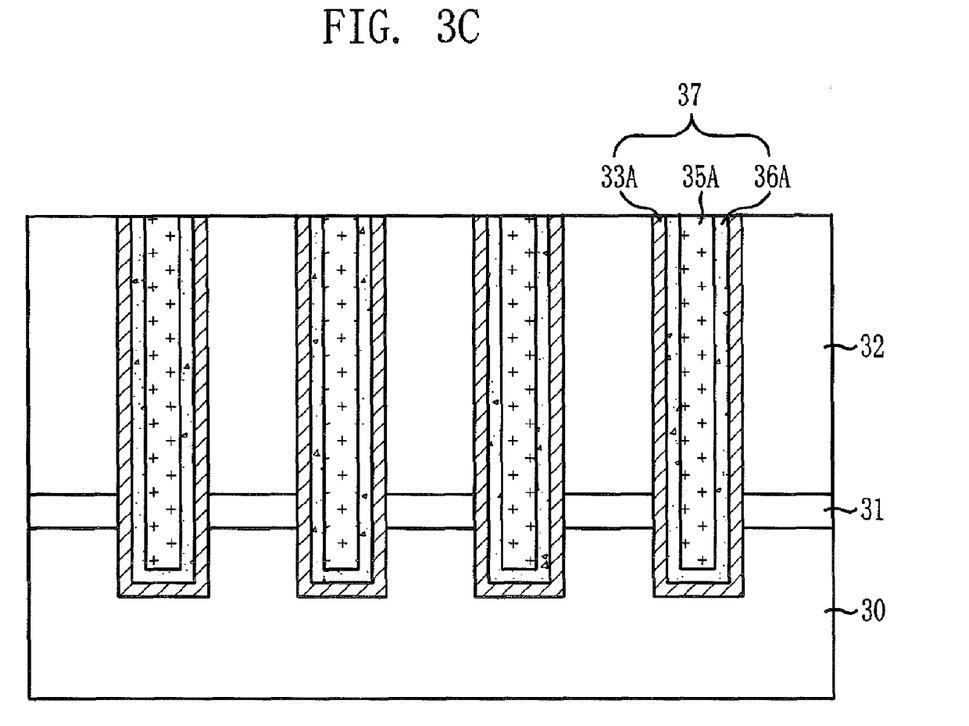

FIGS. 3A to 3C illustrate cross-sectional views of a method for forming a metal line in a semiconductor device in accordance with a second embodiment of the present invention. The second embodiment of the present invention describes a different method for forming an AlCu alloy layer than the first embodiment. In the first embodiment, a copper layer is formed prior to forming an aluminum layer, and a thermal process is performed after the aluminum layer is formed to form an AlCu alloy layer. In the second embodiment, copper source gas is supplied while forming an aluminum layer rather than forming a separate copper layer. Hereinafter, a method for forming a semiconductor device according to the second embodiment is briefly described referring to FIGS. 3A to 3C. Some detailed descriptions may be omitted because the second embodiment of the present invention employs substantially the same conditions as those described in the first embodiment, excluding the method for forming an AlCu alloy layer.

Referring to FIG. 3A, a first insulation pattern 30, an etch stop layer 31, and a second insulation pattern 32 are formed over a substrate (not shown) including a plurality of conductive layers (not shown). Specifically, a first insulation layer is formed over the substrate. A nitride-based layer is formed as an etch mask over the first insulation layer. A second insulation layer is formed over the nitride-based layer. The second insulation layer includes an oxide-based material having a different selectivity than the nitride-based layer.

Portions of the second insulation layer, the nitride-based layer, and the first insulation layer are etched to form trenches. Thus, the first insulation pattern 30, the etch stop layer 31, and the second insulation pattern 32 are formed. A barrier metal layer 33 is formed over the resultant structure. The barrier metal layer 33 may include a stack structure comprising Ti/TiN, Ti/TiN/Ti, Ta/TaN, Ta/TaN/Ta, Ti/TiSiN, or Ti/TiSiN/Ti.

Referring to FIG. 3B, an aluminum layer 35 is formed over the barrier metal layer 33 and fills the trenches. In one embodiment, the aluminum layer 35 is formed using a CVD method. Copper source gas is supplied while forming the aluminum layer 35 such that an AlCu alloy layer 36 is formed on an interface between the barrier metal layer 33 and the aluminum layer 35. In one embodiment, the AlCu alloy layer 36 is formed and an aluminum layer having a thickness ranging from approximately 200 Å to approximately 1,000 Å is then formed using the CVD method to fill the trenches. A bulk aluminum layer including approximately 0.3% to approximately 1% of copper is formed to a thickness ranging from approximately 1,000 Å to approximately 5,000 Å using a PVD method. In accordance with the second embodiment of the present invention, galvanic corrosion which may occur on the interface between the aluminum layer 35 and the barrier metal layer 33 may be reduced by the AlCu alloy layer 36 formed on the interface between the aluminum layer 35 and the barrier metal layer 33. The AlCu alloy layer 36 may reduce galvanic corrosion because Al has a strong anodic propensity for providing electrons. When Al combines with Cu having a stronger cathodic propensity than Al, an electromigration characteristic improves thereby reducing galvanic corrosion.

Referring to FIG. 3C, a CMP process is performed to form a plurality of metal lines 37 electrically isolated from each other in the trenches. The metal lines 37 each comprise a patterned barrier metal layer 33A, a patterned aluminum layer 35A, and a patterned AlCu alloy layer 36A. The pH and composition of a polish slurry is controlled during the CMP process to decrease pitting corrosion on a surface of the aluminum layer 35 and galvanic corrosion on an interface of the barrier metal layer 33. A typical CMP process includes oxidizing aluminum and then removing the oxidized aluminum using a polish slurry with a pH ranging from approximately 4 to approximately 6. Specifically, an oxidizer of approximately 2 wt % to approximately 6 wt % is added to oxidize the aluminum. Colloidal silica or aluminum oxide ($Al_2O_3$)-based polish particles are used to remove the oxidized aluminum. Thus, according to the second embodiment of the present invention, when forming an aluminum line using a damascene process, corrosion of the aluminum line may be reduced during a CMP process.

A cleaning process is performed to remove slurry residue and polish by-products generated during the CMP process. A solvent-based cleaning solution or a DIW-based cleaning solution is used to prevent corrosion of the patterned aluminum layer 35A. A metal corrosion inhibitor may be added to maintain the pH of the cleaning solution within a range of approximately 8 to approximately 10 when using the DIW-based cleaning solution. Amine-based hydrazine or HF may also be added. Thus, according to the second embodiment of the present invention, when forming an aluminum line using a damascene process, corrosion of the aluminum line may be reduced during a cleaning process after a CMP process is performed. Principles of an anti-galvanic corrosion effect according to the second embodiment are substantially the same as those described above with regard to the first embodiment of the present invention.

According to the first and second embodiments of the present invention, a metal line in a semiconductor device includes an anti-galvanic corrosion layer (e.g., the AlCu alloy layer) formed on an interface between a barrier metal layer formed over an insulation layer having trenches and a metal layer for forming the metal line formed over the barrier metal layer to fill in the trenches. The anti-galvanic corrosion layer includes an alloy layer comprising a material of the metal layer. The metal layer includes Al having a strong anodic propensity. The alloy layer includes an AlCu alloy layer comprising a combination of Cu having a strong cathodic propensity and Al.

While the present invention has been described with respect to the specific embodiments, it will be apparent to those skilled in the art that various changes and modifications may be made without departing from the spirit and scope of the invention as defined in the following claims.

What is claimed is:

1. A metal line in a semiconductor device, the metal line comprising:
   an insulation layer having trenches formed therein;
   a barrier metal layer formed over the insulation layer and the trenches;
   a metal layer formed over the barrier metal layer, wherein the metal layer fills the trenches; and
   an anti-galvanic corrosion layer formed on an interface between the metal layer and the barrier metal layer,
   wherein the anti-galvanic corrosion layer comprises an alloy layer including a material of the metal layer migrated from the metal layer.

2. The metal line of claim 1, wherein the anti-galvanic corrosion layer comprises an alloy layer including the material of the metal layer.

3. The metal line of claim 2, wherein the material of the metal layer comprises aluminum (Al).

4. The metal line of claim 2, wherein the alloy layer comprises an AlCu alloy layer.

5. The metal line of claim 1, wherein the barrier metal layer comprises a stack structure selected from a group consisting of titanium (Ti)/titanium nitride (TiN), Ti/TiN/Ti, tantalum (Ta)/tantalum nitride (TaN), Ta/TaN/Ta, Ti/titanium silicon nitride (TiSiN), and Ti/TiSiN/Ti.

* * * * *